United States Patent [19]

Bowler et al.

[11] 4,048,669

[45] Sept. 13, 1977

[54] TELEVISION MODULE SUPPORT AND CARRIER

[75] Inventors: John W. Bowler, Arlington Heights; Kenneth E. Karner, Addison; Daniel I. Pittenger, Libertyville; Donald A. Schwartz, Melrose Park, all of Ill.

[73] Assignee: Zenith Radio Corporation, Glenview, Ill.

[21] Appl. No.: 618,987

[22] Filed: Oct. 2, 1975

[51] Int. Cl.² .............................................. H02B 1/02
[52] U.S. Cl. .................................... 361/391; 361/415; 358/254
[58] Field of Search ................. 317/101 CB, 101 DH; 178/7.8, 7.9; 361/391, 415

[56] References Cited

U.S. PATENT DOCUMENTS

| 3,198,991 | 8/1965 | Barnett | 317/101 DH |
| 3,637,932 | 1/1972 | Wigley | 317/101 DH |
| 3,708,618 | 1/1973 | Hofmeiser | 317/101 CB |
| 3,758,716 | 9/1973 | James et al. | 317/101 CB |
| 3,925,710 | 12/1975 | Ebert | 317/101 DH |

FOREIGN PATENT DOCUMENTS 996,442 6/1965 United Kingdom ......... 317/101 DH

OTHER PUBLICATIONS

B. L. Berger et al, "Printed Circuit Card Connector" IBM Tech. Bull., vol. 11, No. 7, Dec. 1968, p. 723.

Primary Examiner—David Smith, Jr.
Attorney, Agent, or Firm—Roy A. Ekstrand

[57] ABSTRACT

A television cabinet defines a cavity within which a CRT and associated circuitry are supported. The base portion of the cabinet defines three internal channels. A module support, formed of nonconductive material, defines three internal channels which support three printed circuit modules. Three flanges formed on the lower portion of the module support coact with the cabinet base channels to permit slide mounting of the module support, bearing the printed circuit modules, within the cabinet enclosure. A cabinet back includes a retaining surface which abuts the ends of the module support channels to retain the modules therein. The module support is stackable with other module supports while bearing the printed circuit modules thereby serving as a transportation carrier therefor.

7 Claims, 3 Drawing Figures

TELEVISION MODULE SUPPORT AND CARRIER

BACKGROUND OF THE INVENTION

This invention relates to television receiver assembly and construction.

Typically a television receiver may include a cabinet housing a CRT display device and a metal chassis supporting a plurality of printed circuit modules containing receiver signal processing and display producing circuitry. Electrical connections are made between the modules, the CRT display device and the remainder of the receiver circuitry by either permanent solder connections or mechanical connector assemblies. A cabinet back, affixed to the rear portion of the cabinet, completes the cabinet enclosure.

In some television manufacturing operations, generally those of smaller volume, the receiver chassis, printed circuit modules, electrical interconnections and supporting cabinet are manufactured and assembled at one location. More often, however, television manufacturing operations are dispersed among a number of "feeder" plants, each of which may specialize in the production of a portion of a receiver. For example, the printed circuit modules may be assembled at one plant, the metal chassis frame fabricated at another, the cabinet at a third, etc., with the output of each plant shipped to still another for assembly, alignment, testing and packaging of the receiver. It is also common to further divide manufacturing facilities and utilize a number of plants to produce subassemblies for other plants in the system. Whenever the manufacture of the printed circuit modules takes place at a remote location, they obviously must be packaged for transportation and/or storage. During chassis assembly the modules are unpacked, mounted to the metal chassis and electrically connected.

Although the shape, size and number of printed circuit modules used vary with individual manufacturer preferences, their basic construction is similar. An insulating board or substrate has metalized connection pattern, typically formed by a photoetching process, on at least one surface and a plurality of circuit components supported on the other surface, each component having lead connections which pass through holes in the board for soldering at appropriate points on the metalized pattern. The circuit components are themselves of differing configurations and sizes giving the completed module an irregular volumetric shape which makes storage difficult and exposes those components which extend farthest from the board to risk of damage during handling and storage.

Because of this irregular configuration and the fragile nature of the printed board and the components thereon, specifically designed transporting carriers are generally employed to transport and store the modules in multi-plant manufacturing operations. In a typical construction, cardboard or similar material forms a multi-celled container which accommodates the printed circuit modules. The completed modules are placed within the container (generally one per cell) and stored or shipped. During assembly the modules are removed from the container and the now-empty-container is returned to the module source. One can readily see that expenses associated with such packing and unpacking operations as well as those associated with return shipment of empty containers can constitute significant expense.

The fragile nature of the printed circuit modules also entails risk of damage when the modules are assembled on the chassis, especially if fasteners are used. Sometimes mechanical stresses may damage the printed circuit board, creating defects which are not detectable by testing. Such latent defects may only become a problem after hours of repeated temperature cycling inherent in normal operation of the receiver.

In addition to the above problems of module transportation and storage, a television receiver of the type described may not be readily serviceable in the field. For example, if the receiver modules are permanently affixed to the chassis by solder connections, module accessibility is limited and servicing may require that the entire chassis be removed to a remote servicing location notwithstanding that only a single module may be in need of repair. Some improvement in this aspect of serviceability is realized by some recent receivers which incorporate removable modules having electrical connections made by connectors.

Here again, removal of the modules from the protective environment of the receiver for servicing entails a risk of damage during transportation. Some television service organizations use module transporting carriers, similar to those used in the factory, to minimize this risk. This, of course, requires additional expense and space.

OBJECTS OF THE INVENTION

It is an object of the present invention to provide a television receiver of improved construction.

It is another object of the present invention to provide a television receiver which is readily assembled and serviced.

SUMMARY OF THE INVENTION

Module support means, for use in a television receiver having signal processing circuitry disposed on a plurality of printed circuit modules, are formed of nonconductive impact-absorbing material defining a plurality of internal channels which support the printed circuit modules free of mechanical stresses in either fully or partially inserted positions. A cabinet defines an enclosure and retaining means which coact with the support means to position and retain the module support means within the cabinet. The module support means are removable from the cabinet, while still supporting the printed circuit modules, thereby serving as a transporting and storage carrier therefor.

BRIEF DESCRIPTION OF THE DRAWINGS

The features of the present invention which are believed to be novel are set forth with particularity in the appended claims. The invention, together with further objects and advantages thereof, may best be understood by reference to th following description taken in connection with the accompanying drawings, in the several figures of which reference numerals identify like elements, and in which:

DESCRIPTION OF THE PREFERRED EMBODIMENT

Figure 1:
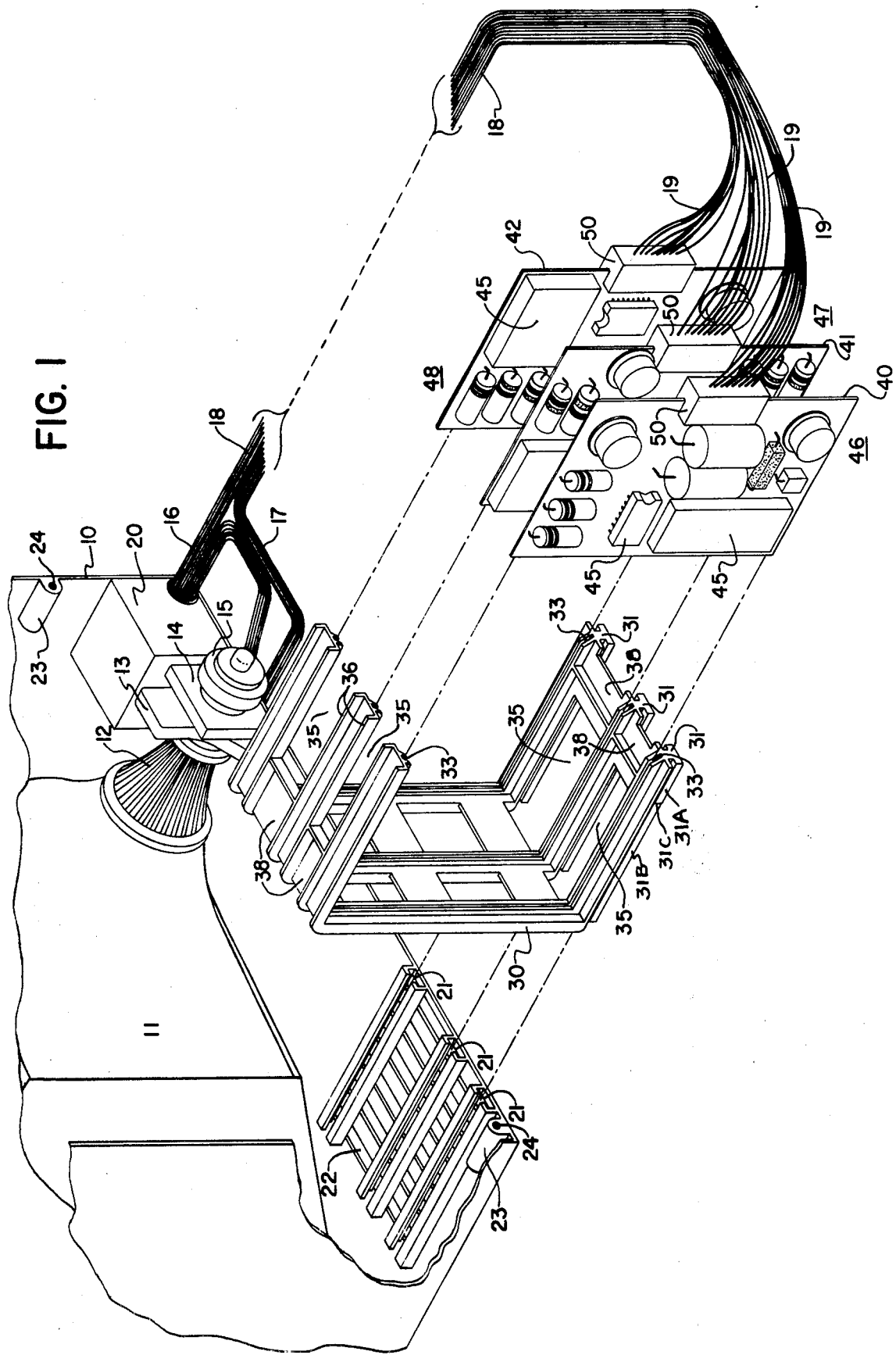
FIG. 1 is an assembly drawing of a module support constructed in accordance with the present invention.

Referring now to FIG. 1, a television cabinet 10 defines a cavity within which a tri-color delta-gun cathode ray tube (CRT) display device 11 is supported together with a power supply module 20. Lead wire groups 16, 17 and 18 make appropriate connections between a deflection yoke 12, a convergence assembly 13 and a CRT socket 15, all of conventional construction, supported by the neck of CRT 11 and power supply module 20 supported within cabinet 10. A blue lateral assembly 14 also of conventional construction is supported by the neck of CRT 11. Lead wire group 18 divides into three groups 19 each of which make connections to a group of printed circuit modules 46, 47 and 48 via three connectors 50. Retaining means comprising a plurality of rectangular internal channels 21 formed in the bottom of cabinet 10 and a number of bosses 23 each defining a hole 24 are spaced about the periphery of the cabinet. A generally U-shaped module support 30 formed of nonconductive impact-absorbing material defines three internal channels 33 and external flanges 31. Flanges 31 define a wide portion 31A and a narrow portion 31B both of substantially T-shaped cross section. Both portions are of such size as to permit them to slide into channels 21 retaining the module support within cabinet 10. Each flange defines a pair of shoulders 31C, the function of which will be explained below. In the embodiment shown, module support 30 is a molded plastic component and defines structural members 36 which strengthen the module support using a minimum of additional material. A number of cross pieces 38 of ribbed construction reinforce the module support and maintain module separation.

Printed circuit modules 46, 47 and 48 are of conventional construction, comprising an assortment of electronic circuit components 45 which comprise receiver signal processing and display producing circuitry disposed upon the component bearing surfaces of printed circuit boards 40, 41 and 42, respectively. Each circuit board has a metalized connecting pattern 39 (shown in FIG. 3) on the opposite surface, forming appropriate interconnections between components 45. Three edge-connector assemblies 50, of well-known construction, coact with connecting pad metalization areas 51 (shown in FIG. 3) adjacent one edge of printed circuit boards 40, 41 and 42 connecting the lead wire groups to the metalized connecting pattern.

As mentioned, power supply 20 and CRT 11, as well as deflection yoke 12, convergence assembly 13 and blue lateral assembly 14, are of conventional construction appropriate to a tri-color television receiver utilizing a "delta-gun" CRT. It should be clear that should a monochrome or different type color CRT be used, the associated circuitry would be selected accordingly.

During assembly of the television receiver, each of modules 46, 47 and 48 is inserted into its appropriate internal channels 33 in module support 30 which, in turn, is inserted into cabinet 10 by sliding flanges 31 into corresponding internal channels 21. Preferably, either of the sections 31A or 31B of flanges 31 are tapered to provide a snug fit between module support 30 and cabinet enclosure 10. Shoulder 31C coacts with a corresponding shoulder (not shown) within channels 21 to restrict the depth of insertion. A connector assembly 50 is then attached to each module. The connectors and "edge contacts" of the individual boards may be coded to preclude erroneous connections.

It should be noted at this point that the printed circuit modules are retained within module support 30 without the use of fasteners, thereby avoiding potentially damaging stresses on the modules as well as eliminating the expense associated therewith.

Additionally, while not shown clearly, the wires in lead wire groups 19 are long enough to permit modules 46, 47 and 48 to be moved to a partially withdrawn position. In this position with the set back removed, the modules are still supported by module support 30, while remaining connected to the receiver, thus enabling receiver operation while allowing access to components 45 for ready servicing of the receiver and operational evaluation of the modules. In addition, each module may be readily removed from module support 30 should replacement prove necessary.

Module support 30 maintains the circuit modules in parallel vertical orientation to form a ventilation "chimney" for heat removal. To enhance ventilation, the module support defines pairs of top and bottom ventilation apertures 35 between channels 33. Vent apertures 22 are provided in the cabinet to enable a flow of air over the components of the modules. Heat generated by the modules is removed by convection air currents flowing through vents 22 and apertures 35.

Figure 2:
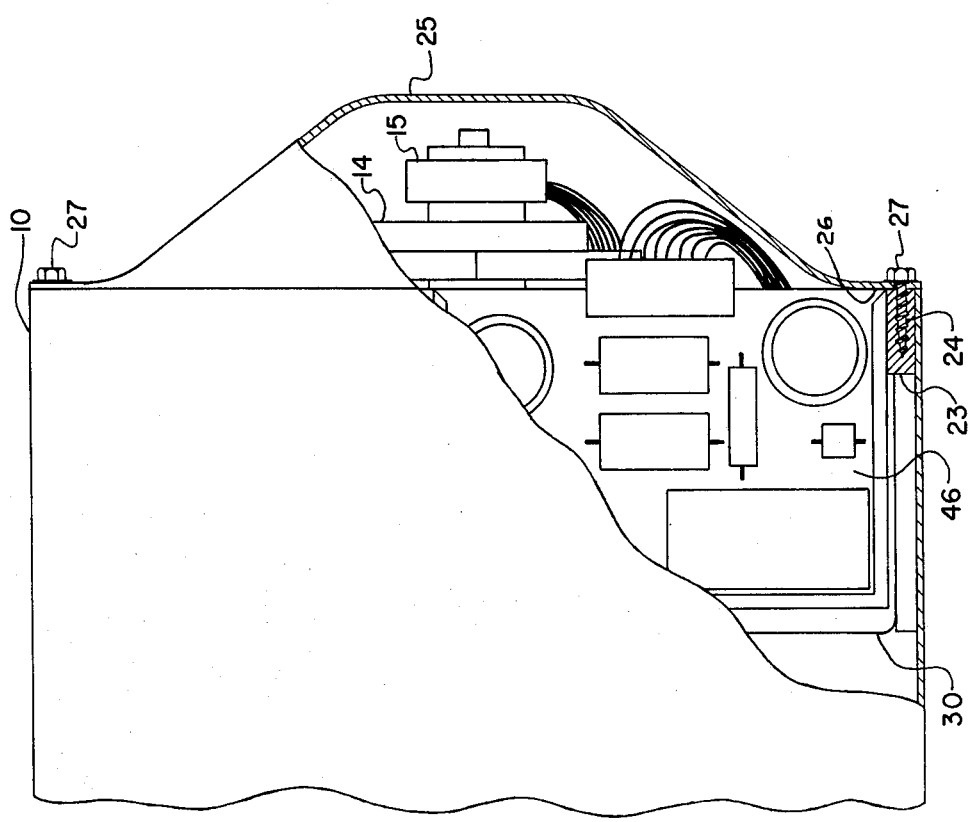
FIG. 2 is a partially broken away drawing of an idealized assembled receiver constructed in accordance with the present invention.

It will be recognized that the partially broken away view of an assembled television receiver in FIG. 2 is illustrative only. Module support 30, bearing the printed circuit modules, is seated within enclosure 10 in the manner described above. A cabinet back 25 is attached to the rear edge of cabinet 10 by a plurality of fasteners 27 seated in holes 24. Back 25 is of substantially conventional construction with the exception of a relatively large retaining surface 26 extending along its lower edge which performs a dual function. Firstly, it covers the ends of channels 21 to positively retain the module support within the cabinet and secondly, it covers channels 33 to positively retain the modules within the module support. It should be noted that fasteners are not used nor needed to retain the modules within module support 30, which helps assure stressfree retention of the modules.

Should the receiver require servicing, back 25 may be removed and, as mentioned, one or more of the modules partially withdrawn and tested while the receiver is still operational. If more extensive servicing is required the defective module may be disconnected and removed from the receiver. However, due to the ease with which module support 30 may be removed from cabinet 10, it will generally be advantageous to remove all the modules and use the module support as a transporting carrier to minimize the possibility of module damage.

Figure 3:
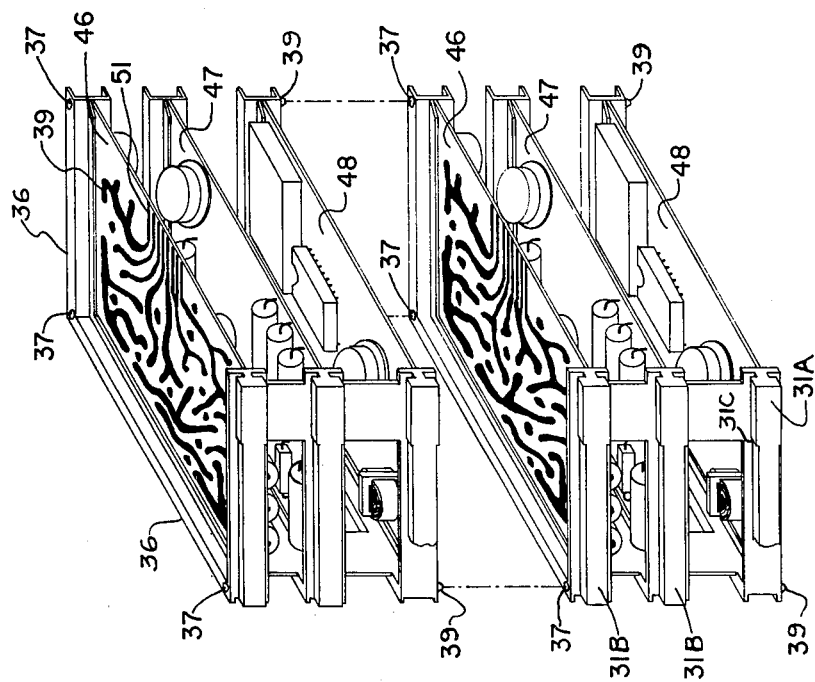
FIG. 3 shows a pair of module supports, each bearing printed circuit modules arranged for stacking.

FIG. 3 shows a modification of the module support allowing several of them to be stacked for storage or transportation. Since each module board is rectangular, it may be reversed within its channel. This permits reorientation of the otherwise exposed components 45 on one of the end modules to face inwardly for additional protection during shipment and storage (see module 46 in FIG. 3). Each of the module supports include nesting means comprising a plurality of projections 39 on the one outer structural member 36 and a corresponding plurality of indentations 37 on the opposite outermost structural member 36. In the stacked position, projections 39 mate with indentations 37 to "nest" the module supports and impeding lateral movement therebetween. As a result, the module supports bearing the printed circuit modules may be conveniently stacked and stored. Similarly, the module supports may be stacked within a conventional shipping carton, or container, for transportation in which case the combined strength of the stacked module supports form an excellent protective environment for the printed circuit modules.

What has been shown is a compact, lightweight, multipurpose carrier for supporting television receiver printed circuit modules free of mechanical stress during transportation, storage and installation.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. For use in a television receiver having signal processing and display producing circuitry disposed on a plurality of printed circuit modules, cable means making electrical connections thereto, and a cabinet defining an enclosure and retaining means therein; module housing and transporting means comprising:

module support means, formed of nonconductive impact-absorbing material, defining a plurality of internal channels which accommodate said plurality of printed circuit modules and support them free of mechanical stresses either fully or partially inserted within said module support means while said cable means still maintain all said electrical connections and said module support means remain within said cabinet; said module support means, coacting with said retaining means to position and retain said module support means within said cabinet such that said module support means are removable from said cabinet, while still supporting said printed circuit modules, thereby serving as a transporting and storage carrier therefor.

2. Module housing and transporting means as set forth in claim 1, wherein said module support means position said printed circuit modules in a substantially parallel array.

3. Module housing and transporting means as set forth in claim 2, wherein each of said printed circuit modules includes a plurality of connection pads positioned adjacent one edge of each of said printed circuit modules, said pads cooperating with said cable means to form a plurality of electrical connections.

4. Module housing and transporting means as set forth in claim 3, wherein said retaining means defines a plurality of internal channels and wherein said module support means define a corresponding plurality of flanges, cooperating with said internal channels to slide mount said module support means within said cabinet enclosure.

5. Module housing and transporting means as set forth in claim 4, wherein said printed circuit modules each include an insulating planar board having a first side supporting a plurality of circuit components and a second side bearing a predetermined metalized pattern interconnecting said components and wherein said support means reversibly accommodate said printed circuit modules in either an operational position in which the outer ones of said modules each have their respective component-bearing surfaces outwardly facing or a reverse position in which the outer ones of said modules each have their respective component bearing surfaces inwardly facing within said support means.

6. Module housing and transporting means as set forth in claim 5, wherein said module support means define nesting means for positive positioning which inhibits lateral movement of said module support means relative to each other thereby permitting a plurality of said support means to be stacked during transportation and storage.

7. Module housing and transporting means as set forth in claim 6, wherein said cabinet means includes a cabinet and a removable cabinet back completing said enclosure and wherein said cabinet back when united with said cabinet locks said module support means within said enclosure and said modules within said module support means.

* * * * *